(12) United States Patent
Fiscus (10) Patent No.: US 6,492,852 B2
(45) Date of Patent: Dec. 10, 2002

(54) PRE-DIVIDER ARCHITECTURE FOR LOW POWER IN A DIGITAL DELAY LOCKED LOOP

(75) Inventor: Timothy E. Fiscus, South Burlington, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/823,152

(22) Filed: Mar. 30, 2001

(65) Prior Publication Data

US 2002/0140471 A1 Oct. 3, 2002

(51) Int. Cl.[7] ............................................. H03L 7/08
(52) U.S. Cl. ........................................ 327/158; 327/151
(58) Field of Search .......................... 327/151, 156, 327/158, 161, 162, 163, 276, 277

(56) References Cited

U.S. PATENT DOCUMENTS

| | | | | |
|---|---|---|---|---|
| 4,325,031 | A | 4/1982 | Ooms et al. ................. | 331/1 A |
| 5,548,250 | A | 8/1996 | Fang ............................ | 331/14 |
| 5,663,687 | A | 9/1997 | Kozu ............................ | 331/14 |
| 5,990,715 | A * | 11/1999 | Nishimura ................... | 327/158 |
| 6,043,694 | A | 3/2000 | Dortu .......................... | 327/156 |
| 6,060,916 | A | 5/2000 | Park ............................ | 327/293 |
| 6,066,969 | A | 5/2000 | Kawasaki et al. ........... | 327/156 |
| 6,069,506 | A * | 5/2000 | Miller et al. ................ | 327/156 |
| 6,087,868 | A | 7/2000 | Millar ......................... | 327/156 |
| 6,094,727 | A | 7/2000 | Manning .................... | 713/400 |
| 6,127,866 | A | 10/2000 | Chu et al. .................... | 327/158 |
| 6,137,327 | A | 10/2000 | Schnell ........................ | 327/158 |
| 6,137,328 | A | 10/2000 | Sung ........................... | 327/158 |
| 6,229,363 | B1 * | 5/2001 | Eto et al. ..................... | 327/158 |
| 6,269,051 | B1 * | 7/2001 | Funaba et al. ................ | 331/51 |
| 6,316,976 | B1 * | 11/2001 | Miller et al. ................ | 327/156 |

OTHER PUBLICATIONS

Kim et al., "A 64–Mbit, 640–MByte/s Bidirectional Data Strobed, Double–Data–Rate SDRAM with a 4–mW DLL for a 256–MByte Memory System", vol. 33, No. 11, Nov. 1998, pp. 1703–1710.

Hasegawa et al., "A 255 Mb SDRAM with Subthreshold Leakage Current Suppression", Solid–State Circuits Conference, 1998. Digest of Technical Papers, Feb. 1998, pp. 80–81,418.

* cited by examiner

Primary Examiner—Timothy P. Callahan
Assistant Examiner—Linh Nguyen
(74) Attorney, Agent, or Firm—Robert A. Walsh; McGinn & Gibb, PLLC (57) ABSTRACT

A delay locked loop circuit for conserving power on a semiconductor chip is provided. The circuit includes a delay chain circuit responsive to a clock input signal for generating an output clock signal having a selectively adjustable delay at an output circuit; a feedback loop circuit connects to and controls said delay chain circuit; and a pre-divider circuit connected to said delay chain circuit, wherein said pre-divider circuit is configured to disable the delay chain circuit when the output clock signal is inactive and the memory device is in an idle state (i.e., all banks closed).

15 Claims, 6 Drawing Sheets

PRE-DIVIDER ARCHITECTURE FOR LOW POWER IN A DIGITAL DELAY LOCKED LOOP

BACKGROUND OF THE INVENTION

1. Field of the Invention

The present invention relates to semiconductor memories and more particularly, to an improved delay locked loop (DLL) circuit design for power conservation that synchronizes a system clock with data output lines.

2. Description of the Related Art

Semiconductor memories, such as synchronous dynamic random access memories (SDRAMs), rambus DRAM, a synclink DRAM and Double Data Rate (DDR-SDRAM) memories, typically include delay lock loop (DLL) circuits. DLLs function to cancel on-chip amplification, signal processing and buffering delays. DLLs also improve input/output timing margins, the output from which include a latency adjusted read clock signal. A "read" operation in DDR-SDRAMs are designed such that signal transitions present on output data lines (DQs) are synchronized to transitions of the system clock. The DLL circuit requires significant additional current to power the memory device, where lowest power requirements are desirable. When using a DLL circuit to generate this latency adjusted read clock output signal, the DLL typically operates at either the same or twice the system clock depending upon the design, this can lead to a significant power requirement. Recent concerns have brought about many ways of reducing this power demand. Most of these approaches include a trade-off between power and resulting accuracy of the latency adjusted clock. One solution to reduce power requirements is to update the DLL less frequently, which in turn reduces the accuracy of the read clock. This is accomplished by placing a divider in front of the update/control circuitry, thus forcing the control circuitry to operate at a lower frequency and reducing power usage.

There are many types of DLL's formed from analog, digital or a combination of analog and digital circuits that provide control to an adjustable delay line. The "real" on-chip delays for which the DLL is designed to null-out is conventionally "modeled" as a delay block which is placed within the DLL's feedback path. The mimic delay block is constructed in such a manner as to match the total delay of the "real" on chip delays associated with component elements such as, an input receiver, signal processing/data path circuits, output driver, package, on chip RC wire and associated buffering.

Figure 1:
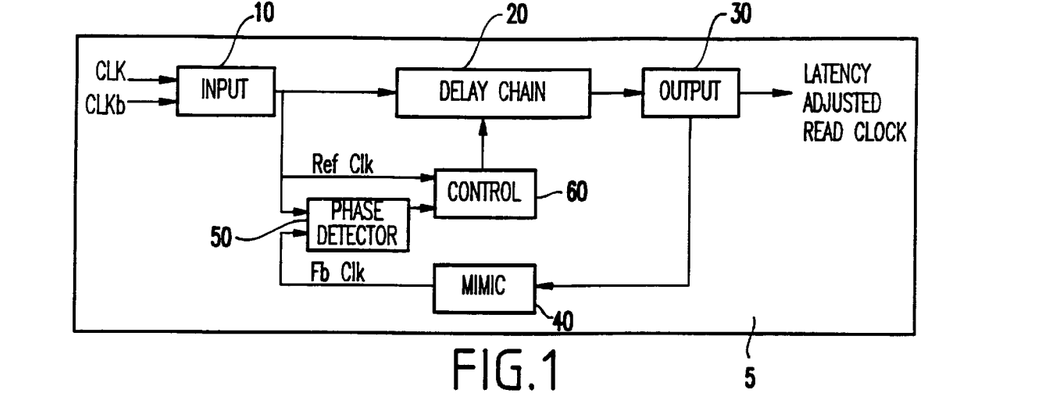
FIG. 1 is a block diagram of a typical digital DLL.

FIGS. 1–4 are not necessarily prior art and may not be generally known to those ordinarily skilled in the art at the time of filing of the invention. These figures are provided to illustrate the state in the art and may not be well known. As shown in FIG. 1, conventional memory chips using the "modeled" delay (i.e., mimic 40) often use an inverter chain or similar techniques to account for delays. The accuracy or ability of the mimic block 10 to match the "real" delay is an important parameter since it directly effects the final phase alignment between the transitions edges of the clock signal VCLK (inputs) and the DQ (outputs) signals.

The task of the DLL circuit is to generate an on-chip signal, which is precisely adjusted in time such that, when said signal is used by subsequent on chip circuits (i.e., data path first-in-first-out buffer+OCD) the desired aforementioned edge aligned phase relationship is achieved between VCLK (in) and DQ (out). The DLL generated output signal meeting these requirements will hence forth be refereed to as the "latency adjusted read clock signal."

A generalized form of a digital DLL is shown in FIG. 1. External differential signals CLK/CLKb are connected to Input circuit 10. Input 10 receives and amplifies the crossing of differential signals CLK/CLKb and outputs a reference clock (Ref_clk) signal. The operation of the control circuit 60 is synchronous with the Ref_clk signal. Ref_clk is connected to the input of delay chain 20 and phase detector 50. Ref_clk is further delayed by a delay circuit (delay chain) 20 and passed to output driver circuit 30. The resulting signal is split inside of output 30 into two signals. The first of the two signals resulting from the split is buffered and becomes an output of DLL 5 called "latency adjusted read clock," that can be part of a DRAM memory chip. The second signal from the split becomes an input to the mimic circuit 40. The output signal of mimic circuit 40 is the feedback clock (Fb_Clk) signal.

Other components include a phase detector circuit 50 for detecting a phase difference between the reference clock signal (ref_clk) and a feedback clock signal (Fb_clk). A delay control circuit 60 receives as an input signal, the output of the phase detector circuit 50. The delay control circuit 60 includes logic circuitry, which processes instructions from the phase detector. The phase detector 50 indicates whether the Fb_clk signal leads or lags the Ref_clk signal in time. Depending on the design, the phase detector may also indicate the extent to which the lead/lag condition exists. This relationship is communicated to control circuit 60, which in turn provides instruction to the delay chain 20 to increase or decrease its input-to-output propagation delay in order to compensate for the lead/lag condition present at the phase detector. This inspection and correction process continues until the DLL's closed loop system has properly adjusted the total propagation time of the delay chain 20 in such a manner that Ref_clk and Fb_clk signals are perfectly aligned at the phase detector 50. Once the DLL converges on a solution, the DLL is said to be "locked," and at other times, it remains "unlocked". Assuming that mimic circuit 40 accurately reflects the delay for which the DLL is to remove, such a system will produce a latency adjusted read clock that can be used to control other on-chip data processing circuit and ultimately produce DQ signal outputs which are synchronized/aligned with the external CLK signals.

Figure 2:
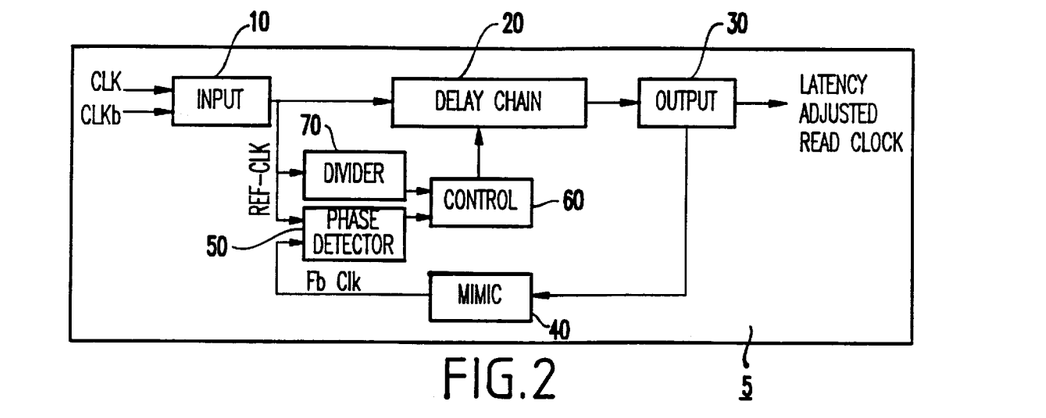
FIG. 2 is a block diagram of a typical digital DLL with a divider placed in front of control block for lower power.

DLL circuits have also been implemented using a divider circuit 70 to reduce power and update DLL states less frequently, as shown in FIG. 2. One problem with this design is that only the delay line's control circuit 60 is operated at a reduced rate/power, leaving the phase detector 50 mimic circuit 40, and delay chain 20 operating at the original higher rate/power levels. Another problem with this architecture is that the maximum operational frequency for which the DLL can sustain is limited. When the reference clock is used to change the operating state pointer of the delay chain circuit and the same reference clock signal propagates through the delay chain circuit, the pointer must update before the reference clock changes states. In other words, as the frequency is increased, the changing of the pointer for the delay chain effects the reference clock being propagated through the delay chain (line). The term "pointer" herein is defined as a digital (or analog) informational state from the control circuit 60 which produces a unique amount of propagation delay within the delay chain/line 20. That is, the control 60 is "pointing" to a location/state for which the delay line is complying and producing a unique amount of propagation delay.

Figure 3:
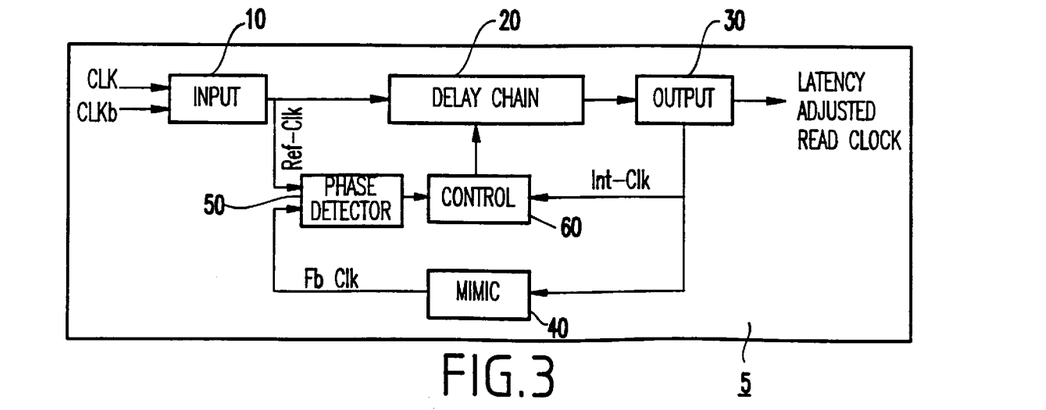
FIG. 3 is a block diagram of a typical digital DLL for higher frequency of operation.
Figure 4:
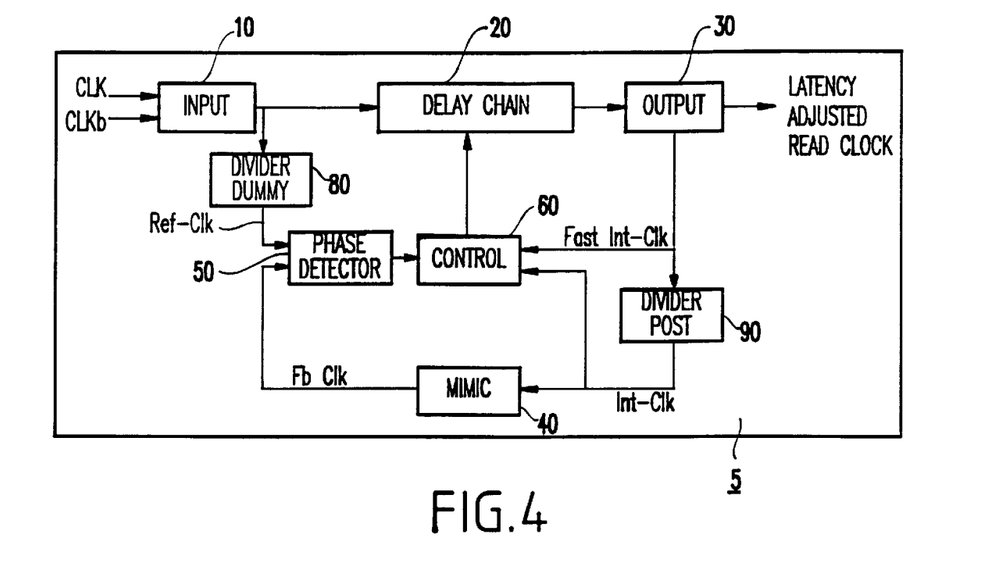
FIG. 4 is a block diagram of a higher frequency DLL architecture as shown in FIG. 3, additionally using a post-divider circuit within the feedback path for conserving power.

Another form of DLL architecture is shown in FIG. 3 that uses the output of the delay chain (line) 20 as the clock signal for the control circuit 60. This architecture enables a higher frequency of operation since the length of the delay chain (line) 20 is of no consequence. Yet another DLL design (FIG. 4) uses this higher frequency DLL architecture and includes an additional divider circuit (post-divider 90) in the feedback path. The introduction of the post-divider circuit 90 reduces the power consumption in the control circuit 60, mimic 50 and phase detector 40. However, since the maximum frequency is determined by the propagation delay from the output of the delay chain (line) to when the pointers change, any increase in propagation delay such as adding a post-divider 90 will decrease the maximum frequency of operation that the DLL can sustain. To eliminate this unwanted reduction in frequency, a "fast" update clock (Fast_Int_clk) for control 60 is extracted prior to the post-divider 90 is provided.

Prior teachings that reduce power consumption in DLL circuits include U.S. Pat. No. 6,066,969, which is incorporated by reference, discloses the use of two delay chain (line) circuits. One delay line circuit is used in the feedback/control loop and the other is used as a delay line for the main output path. A divider circuit is used only before one of these two delay lines, (i.e., the one used in the feedback/control loop). In this design, only the feedback/control loop and associated delay line benefit from reduced power usage using the pre-divider circuit disclosed, whereas power usage in the other (main) delay line does not achieve similar results.

Other DLL designs using circuits to reduce power requirements of the control circuits that include phase detector circuits and the mimic circuits include techniques that update less often using a divider circuit (FIGS. 4) that reduces the frequency of the control logic's clock. Yet others use a control signal that instructs the DLL control circuits to perform updates at periodic intervals. This control signal is normally activated with a timer or operating mode of the DRAM.

Problems associated with these DLL design, as discussed above, include that the delay chain (line) circuitry 20 still consumes significant power, even though the update rates have been reduced while using these techniques. Indeed, the delay chain (line) 20 still operates at one to two times the external clock frequency. Therefore. a need still exists for addressing this aspect of the DLL circuits for improved power conservation, which the present invention addresses.

SUMMARY OF THE INVENTION

With the invention disclosed below, power used by the delay chain (line) circuitry 20 in a DLL is reduced by idling the latency adjusted read clock when it is not needed for a particular mode of SDRAM operation. Many modes of operation exist for a SDRAM that are well known in the art. For example, when a memory bank within a SDRAM is precharged, the status of the bank is commonly referred to as closed. If all the banks are closed the entire memory is said to be in an idle mode of operation. In the idle mode, data can not flow in the data path since a "read" command cannot be transmitted until a "bank activate" command is transmitted, which opens a bank. At least one bank must be open before the read command can be transmitted. When an external device to the DLL such as the memory has idled the output of the DLL, the latency adjusted read clock is unnecessary. Thus, during this idle state, additional power savings can be achieved by altering the frequency of operation within the delay chain (line) 20.

It is, therefore, an object of the present invention to provide an architecture for a device that reduces the power consumed by a digital DLL circuit when the memory device is in an idle state (all banks closed).

The invention provides a DLL circuit that incorporates a pre-divider circuit before a delay chain (line) circuit to reduce the frequency of a clock signal that propagates through the delay line circuit, hence reducing power consumption. The pre-divider circuit is only activated while the latency adjusted read clock signal is not in use as is the case when all memory banks are closed (idle). This allows the DLL to operate at lower power consumption levels without reducing the maximum operating frequency achievable by the overall DLL circuit.

The invention provides a delay lock loop circuit for conserving power on a semiconductor chip having a delay chain circuit and is responsive to a clock input signal which generates an output clock signal having a selectively adjustable delay at an output circuit; a feedback loop circuit connects to and controls the delay chain circuit; and a pre-divider circuit is also connected to the delay chain circuit. The pre-divider circuit is configured to alter the frequency of operation in the delay chain circuit when the output clock signal is not required at full rate.

BRIEF DESCRIPTION OF THE DRAWINGS

The foregoing and other objects, aspects and advantages will be better understood from the following detailed description of a preferred embodiment(s) of the invention with reference to the drawings, in which.

DETAILED DESCRIPTION OF PREFERRED EMBODIMENTS OF THE INVENTION

This invention relates to semiconductor memories with delay lock loop including feedback for synchronizing a system clock with data output lines and reduces power usage. The invention conserves power using an input pre-divider circuit in a delay lock loop (DLL) circuit, preferably in SDRAM devices.

Figure 5:
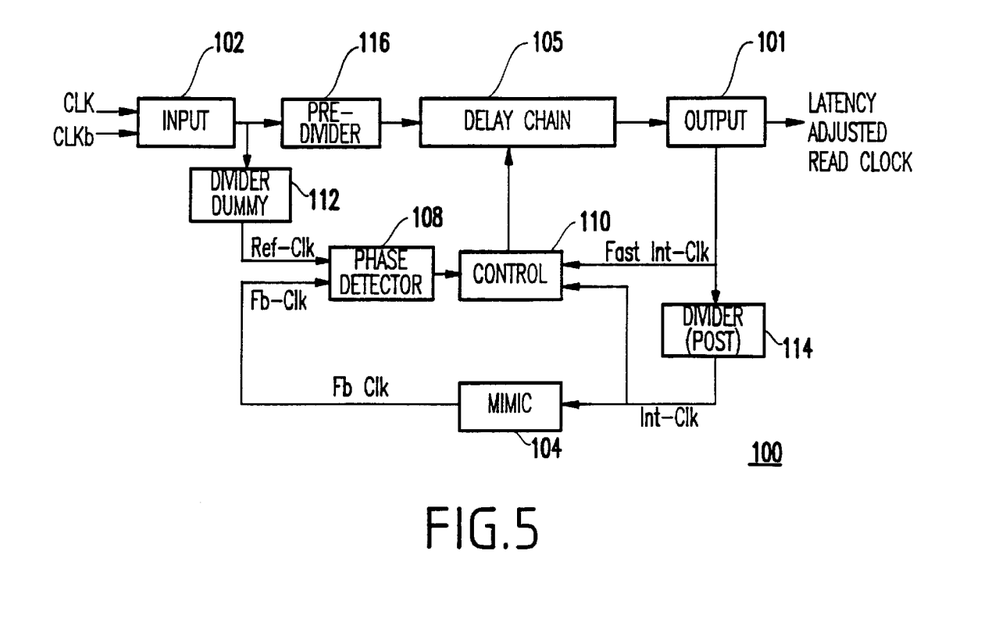
FIG. 5 is a block diagram of a pre-divider circuit in a DLL architecture for conserving power.

Referring now in specific detail to the drawings in which like reference numerals and block identification identify similar or identical elements throughout the several views, and initially to FIG. 5, an improved power conserving DLL circuit 100 is shown. The DLL circuit includes an input circuit 102, pre-divider 116, delay chain (line) 105 and output 101 which form the "primary signal" path leading from system input clock signals(CLK/CLKb) to DLL output signal (latency adjusted read clock signal). In addition to the Primary signal path the DLL contains two sub-paths which create a closed loop feedback system. These two sub-paths travel distinctly different routes inside the DLL but eventually both terminate as input signals to the phase detector 108. The two sub-paths are created by tapping into the "primary" signal path at two different locations along the primary signal path. The two sub-paths are known as the "reference loop" and "feedback loop."

The reference loop signal path begins as an input signal to the dummy divider 112 circuit, the signal passes through dummy divider 112 and terminates as signal Ref_clk, an input to phase detector 108. The feedback loop signal path begins as an input signal to post-divider 114. The signal passes through the post-divider 114 and Mimic 104 circuits and becomes as signal Fb_clk, an input to phase detector 108. The phase detector 108 compares the timing relationship in terms of phase difference of Ref_clk and Fb_clk and issues output signals to control 110, which in turns issues output signals to delay chain (line) 105, and thus completes the closed loop nature of the DLL.

The dummy divider circuit 112 is placed in the reference loop as a matching structure to the post-divider 114 present in the feedback loop. This matches propagation delays of these two dividers, thus preventing an unintended mismatch between the reference and feedback loops. The pre-divider 116 does not require the same since it lies between the points of origin for the reference and feedback loops. As such, the pre-divider 116 can be consider an additional insertion delay and is lumped into the minimum insertion delay associated with the delay chain (line) 105, wherein the minimum insertion delay of the delay chain (line) 105 is defined as the smallest propagation for which the delay chain (line) can be adjusted.

The delay chain(line) circuit 105 and mimic 104 can be realized using analog and/or digital circuit topologies which may include active and/or passive components. Essential criteria for the delay chain 105 include having the ability to adjust its input-to-output delay as a function of a control signal(s) from control circuit 110. A typical realization thereof includes a chain of inverters, wherein the output thereof is extracted at varying locations along the chain. The mimic 104 is designed to match the delay of some other "real" on chip delays for which the DLL is to remove. The mimic delay can be set either manually or automatically. In the case of manual tuning, a typical mimic may contain an inverter chain, which is tuned to match a known "real" delays. In the case of automatic tuning, the mimic can contain an actual copy of the circuits for which the DLL is to remove as a collective block delay. If copies of the actual circuit is strictly used, then the contents of the mimic circuit becomes the actual circuits, which is referred to as a "replicant" form of the mimic circuitry. By using a replicant for the mimic circuit, tracking can be improved. Unfortunately, not all of the real world delays/elements can be copied and be included into the mimic circuit. For example it would be difficult to place a copy of the actual package pin RLC into the mimic circuit, hence some amount of manual tuning of the mimic circuit is required.

Figure 6:
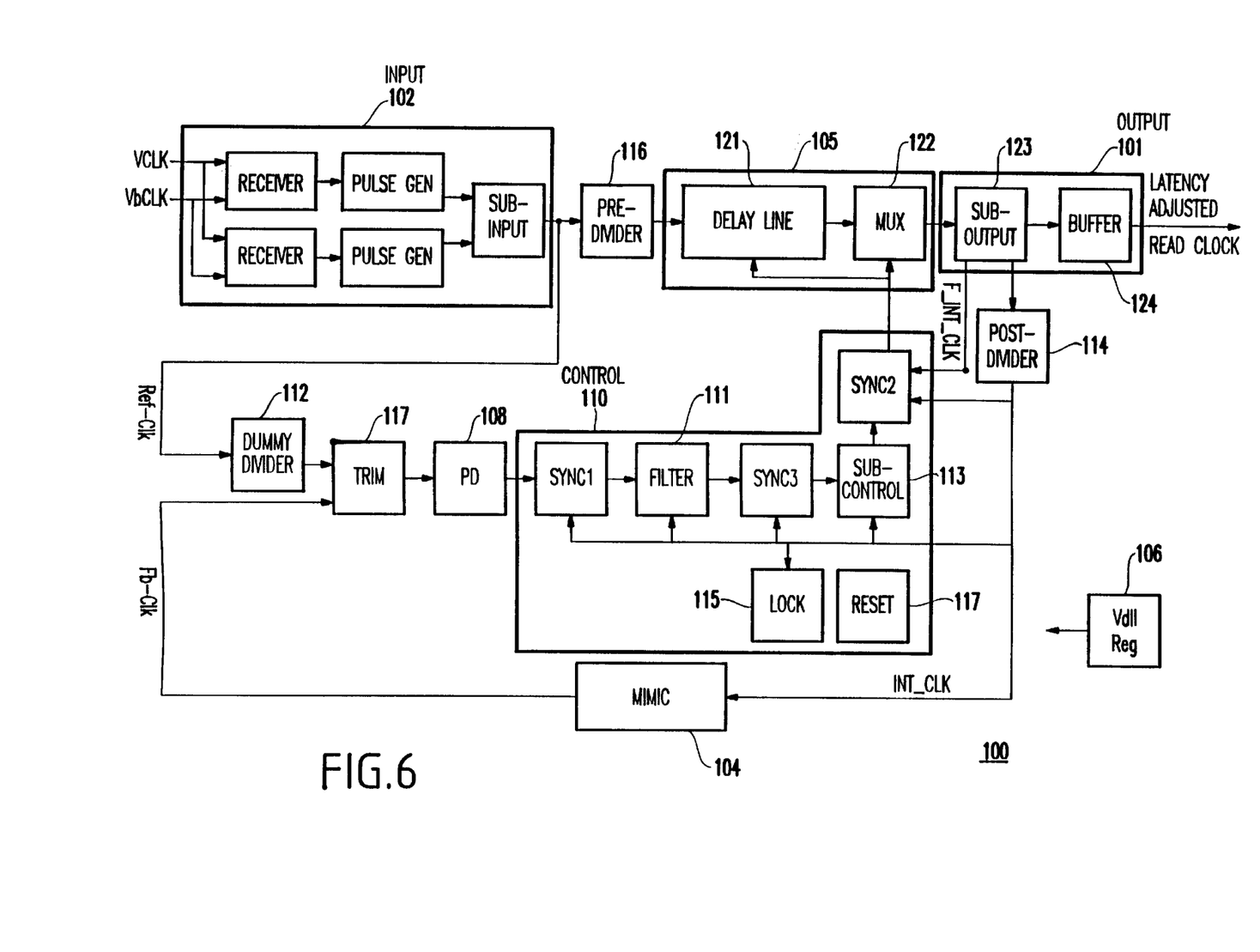
FIG. 6 is a block diagram of an exemplary form of the invention.

Referring now to FIG. 6 (detailed view of FIG. 5), an exploded view of input circuit 102 is provided having two receivers, two pulse generators that in turn input signals to a sub-input circuit. As a functioning unit, the input circuit 102 receives and processes a differential CLK/CLKb clock signals to create a pulse train wherein each and every crossing of the rising and falling edges of these two clock signals is precisely marked with a narrow pulse.

An exploded view of control circuit 110 is shown in FIG. 6 to contain sync1,2,3. filter 11, a sub-control 113, a lock 115 and a reset 117. The sync1,2,3 circuits serve to synchronize the asynchronous output from the phase detector 108 and additionally to orderly process signals into the control block 110. The filter 111 is used to stabilize the otherwise unstable nature of a closed loop system. The sub-control 113 is a control logic circuit. The lock circuit 115 detects when the DLL has settled on a converged solution and the reset 117 circuit forces a known initialized states at power up conditions.

An exploded view of delay chain (line) 105 is shown to contain delay line 121 which is a digital inverter chain and mux 122 which takes the pointer information from control circuit 110 and selects a location within the delay line 121. Output 101 contains the sub-output 123 that provides a signal splitter between the feedback path which leads to post-divider circuit 114 and buffer circuit 124 that boost strength of the output signal (i.e., the latency adjusted read clock signal). In addition, sub-output 123 provides a fast internal clock signal (Fast_Int_clk) to control sync2 within the control circuit 110, which is used in the critical path of the control circuit 110 for updating the pointer location within the delay line 105. Vdll regulator 106 generates a supply voltage used to power several circuit blocks within the DLL circuit. For example, the delay chain (line) 105 is powered by this regulator. The regulator 106 stabilizes circuit performance and provides noise isolation.

The pre-divider circuit 116 is attached before the delay chain (line) circuit 105. Both the pre-divider 116 and post-divider 114 circuits are identical and have the ability to switch using a "divide factor" of between one and X, wherein X is a value greater than one. A divider circuit is enabled when it's output signal is a factor of X slower than the input signal (i.e., not equal to one). The divider circuit is disabled when it's divide factor is one (i.e., no reduction in output rate). When either the pre-or post divider circuits are enabled, the internal clock (Int_clk) which feeds the control circuit 110 is slowed by the divider rate.

Figure 9:
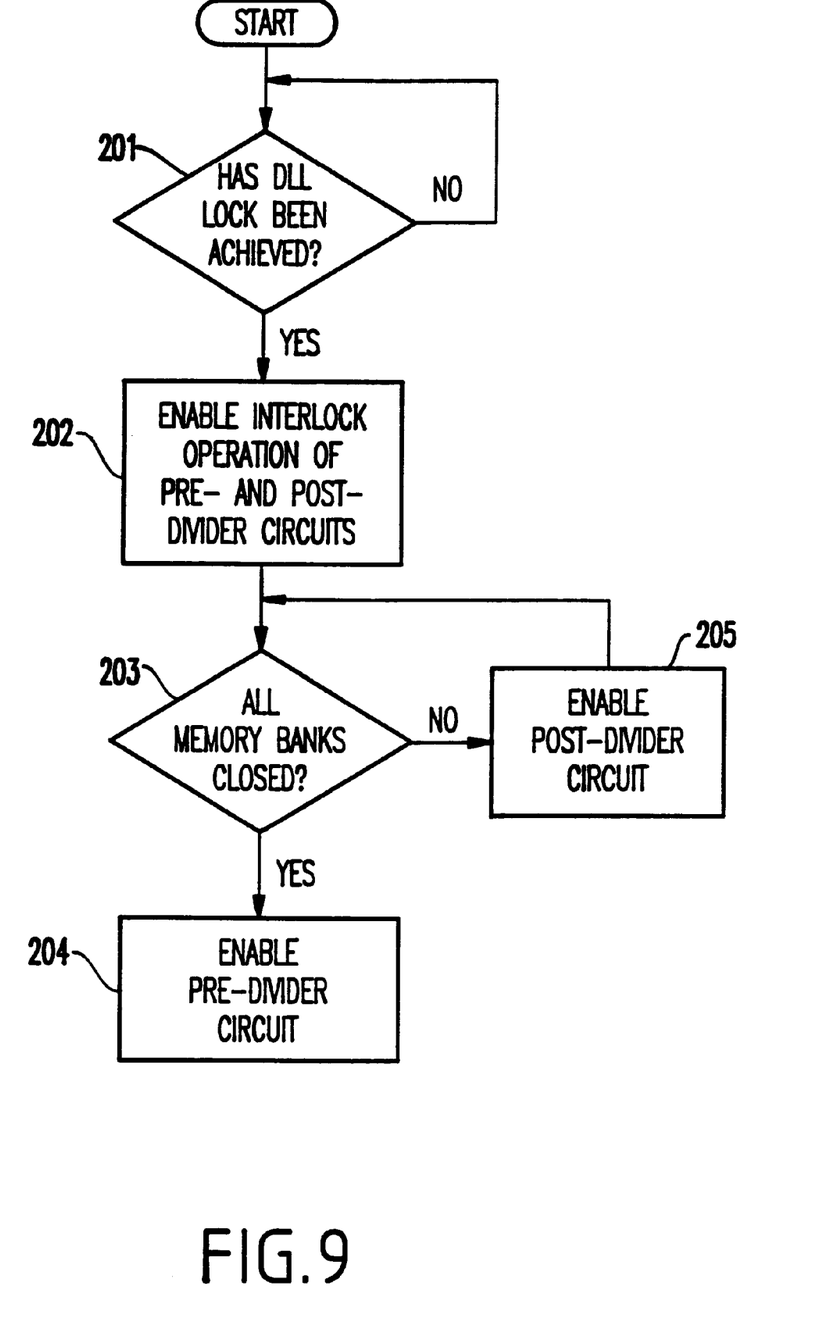
FIG. 9 is a flow diagram of the operation of the divider circuits in the invention.

Referring to FIG. 9, when the DLL circuit of the invention is used as part of a memory device at initialization (start) it remains in an unlocked state until it converges on a solution at which time it becomes locked (step 201). When less time is spent searching for a solution, better results occur. Thus prior to a locked state, the pre-and post-divider circuits 116 and 114 are disabled (i.e., divide by one) so as not to slow down the Int_clk and impede lock acquisition. Once lock has been achieved. the pre-and post-divider circuits are enabled in an interlocking manner (step 202). Using the operational status of external devices of the DLL circuit (step 203), the pre-divider circuit 116 is enabled only when (step 204) the output latency adjusted read clock signal is not required as a full rate (or double rate) output, as is the case when the connected memory device's banks are all closed (idle state). The pre-divider 116 and post-divider 114 operate mutually exclusive of each other. When the pre-divider circuit 116 is enabled, the post-divider 114 is disabled (step 203). This is achieved by an interlock switch that automatically switches between these two divider circuits as a function of memory banks idle status. When all memory banks are closed (idle state), the pre-divider 116 is enabled (divide ratio>1) and the post-divider 114 is disabled (divide ratio=1). When a bank (at least one) is open, the pre-divider ratio=1 and the post-divider ratio>1 and the post divider 114 is enabled (step 205). Note that at any given time (after lock), either divider is enabled. This ensures that the control 110 and mimic 104 circuits are always running at a reduced clock rate, resulting in conserving power. Power savings in the delay chain (line) 105 is only achieved when the pre-divider 116 is enabled.

In addition to the power savings achieved using the pre-and post-divider circuits, additional power savings are attained when using a "power-down" mode of SDRAM operation. When the SDRAM is placed in the power-down mode (by external instruction) the DLL automatically shuts down one-half of the input circuit 102. The signal path (via a receiver/pulse generator in the input circuit 102) associated with the CLKb signal is disabled. This action reduces the output frequency by a factor of two of the pulse train leaving input circuit 102. This action is independent, and in addition to, any previously described behavior related to the pre-and post-divider circuit functions. Yet even more power savings can be achieved in addition to the aforementioned power savings internal to the DLL circuits, when the latency adjusted read clock is not required (idle mode, all banks closed), the DLL can turn off the output buffer circuit 124. Thus, power savings associated with the buffer 124 and external circuits can also be achieved.

Figure 7:
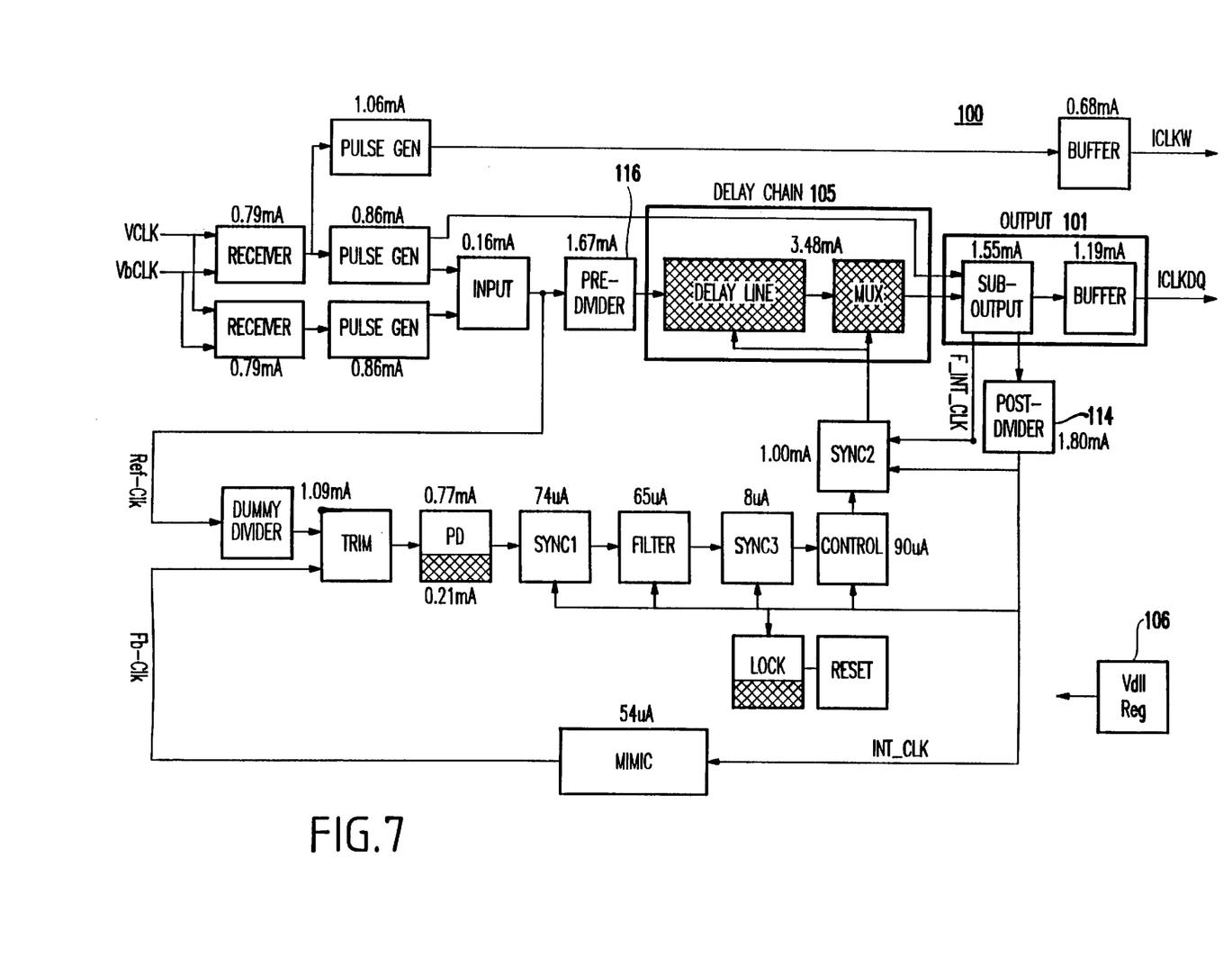
FIG. 7 is a detailed block diagram of a DLL circuit shown in FIG. 6 wherein the currents are shown when the pre-divider circuit OFF.
Figure 8:
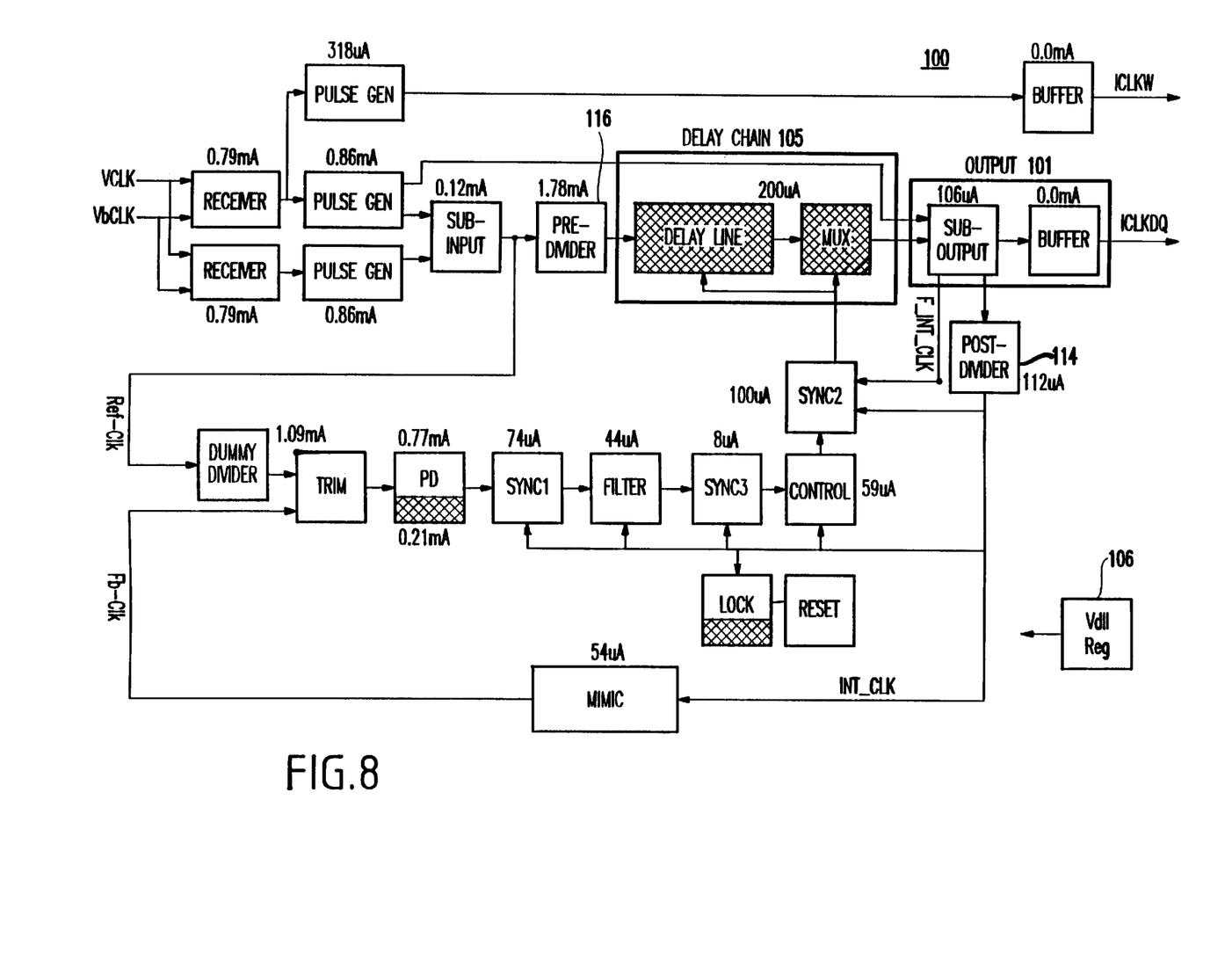
FIG. 8 is a comparable block diagram of FIG. 7 when the pre-divider circuit ON. where current reduction of the Delay Line is in excess of 3 mA.

FIG. 6 shows an exemplary preferred form of the implementation of FIG. 5 in an SDRAM design. FIG. 7 and FIG. 8 show two operational states of the DLL circuit of FIG. 6 as to current flow through the various components shown (note that the components of FIGS. 6–8 are the same with current through the components are in either micro- or milliamperes shown next to the component). In FIGS. 7, current consumption in the DLL circuit is shown when the pre-divider circuit 116 is disabled and the latency adjusted read clock signal is activated and required a full rate. Conversely, FIG. 8 shows the current of this DLL circuit with the pre-divider circuit enabled. Adding the divider reduces the current in the delay chain (line)105 of approximately 3-mA at 133MHz, thus reducing power demands significantly. Additional savings can be found in the output 111 and post-divider 114 circuits. The DLL 100 usually form part of a semiconductor chip that is mounted on a DDR-synchronous dynamic random access memory board (SDRAM) and that obtains the input clock signal, input data signal, and the switching control signal from the DDR-SDRAM board. However, the power conserving enhancements for DLL circuits presented above are not limited to applications of DRAM memory alone. Indeed, any application containing DLL circuits for which periods of non-use are identifiable can save power by using the pre-divider circuit architecture of the invention.

Having described preferred embodiments for a novel delay lock loop circuit for semiconductor memories (which are intended to be illustrative and not limiting), it is noted that modifications and variations can be made by persons skilled in the art in light of the above teachings, those skilled in the art will recognize that the invention can be practiced with modification within the spirit and scope of the appended claims.

What is claimed is:

1. A delay locked loop (DLL) circuit comprising:
   an input and an output;
   a delay chain circuit responsive to an input clock signal, said delay chain circuit generating an output clock signal selectively having an adjustable delay;
   a feedback loop circuit connected to and controlling said delay chain circuit; said feedback loop includes a phase detector for receiving said clock signals and comparing said input clock signal to a feedback clock signal from said output circuit;
   a reference loop circuit including a dummy divider circuit that connects said input clock signal to said phase detector; and
   a pre-divider circuit coupled between said input and said delay chain circuit adapted to alter the rate of said input clock signal based on a selectable mode function of said delay lock loop.

2. The circuit of claim 1, wherein said selectable mode function comprises a switching function having a divider factor, wherein said pre-divider circuit is enabled when said divider factor is not equal to one, and said pre-divider circuit is disabled when said divider factor is equal to one.

3. The circuit of claim 1, wherein said feedback loop circuit further includes a mimic circuit for modeling on-chip delay and a control circuit, both connected to said phase detector.

4. The circuit of claim 3, wherein said feedback loop circuit further includes a post-divider circuit that provides said output signal to said control circuit and said mimic circuit.

5. The circuit of claim 1, wherein said DLL is part of a semiconductor chip mounted on a synchronous dynamic random access memory (SDRAM) board and obtains said input clock signal input data signal from said SDRAM board.

6. The circuit of claim 5, wherein said SDRAM includes a power-down mode and wherein said DLL automatically shuts down a portion of said delay chain circuit to conserve power in said power-down mode.

7. A delay locked loop (DLL) circuit for a semiconductor chip, said circuit comprising:
   an input receiver of a system clock signal, which outputs a first clock signal derived from said system clock signal;
   a delay chain circuit which provides a delay adjusted clock signal;
   a pre-divider circuit coupled between said input receiver and said delay chain circuit, said pre-divider circuit being disabled when said latency adjusted clock signal requirement is at full rate output;
   an output circuit which receives said delay adjusted clock signal and outputs a latency adjusted clock signal based on said delay adjusted clock signal;
   a reference loop circuit including a dummy divider circuit that connects said input clock signal to said phase detector; and
   a feedback loop circuit coupled between said output circuit and said delay chain circuit, said feedback loop circuit including an on-chip delay mimic circuit modeled on-chip delay which outputs a feedback clock signal based on a phase detector circuit, and a control circuit which selectively controls a delay of said delay chain circuit based on a difference between said first clock signal and said feedback signal.

8. The circuit of claim 7, wherein said feedback loop circuit further includes a post-divider circuit connected to said output circuit adapted to alter said latency adjusted clock signal prior to input to said control circuit and to said mimic circuit.

9. The circuit of claim 7, wherein said pre-divider circuit is controlled by a selectable function that comprises a switching function having a divider factor, wherein said pre-divider circuit is enabled when said divider factor is not equal to one, and said pre-divider circuit is disabled when said divider factor is equal to one.

10. The circuit of claim 7, wherein said semiconductor chip is mounted on a double data rate synchronous dynamic random access memory (DDR-SDRAM) board and obtains said system clock signal from said DDR-SDRAM board.

11. The circuit of claim 10, wherein said DDR-SDRAM includes a power-down mode and wherein said DLL automatically shuts down a portion of said delay chain circuit to conserve power in said power down mode.

12. A delay locked loop (DLL) circuit as part of a semiconductor chip mounted on a double data rate synchronous dynamic random access memory (DDR-SDRAM) board and obtains an input clock signal and an input data signal from said DDR-SDRAM board, said DLL circuit comprising;

a delay chain circuit responsive to an input clock signal, said delay chain circuit generating an output clock signal selectively having an adjustable delay;

a feedback loop circuit connected to and controlling said delay chain circuit, said feedback loop circuit includes a phase detector for receiving said clock signals and comparing said input clock signal to a feedback clock signal from an output circuit and said feedback loop circuit further includes a dummy divider circuit that connects said input clock signal to said phase detector; and a pre-divider circuit responsive to said input signal adapted to alter the rate at which said input clock signal is applied to said delay chain based on a selectable function of said output clock signal.

13. The DLL circuit of claim 12, wherein said selectable function comprises a switching function having a divider factor, wherein said pre-divider circuit is enabled when said divider factor is not equal to one, and said pre-divider circuit is disabled when said divider factor is equal to one.

14. The DLL circuit of claim 12, wherein said feedback loop circuit further includes a mimic circuit for modeling on-chip delay and a control circuit, both connected to said phase detector.

15. The circuit of claim 13, wherein said DDR-SDRAM includes a power-down mode and wherein said DLL circuit automatically shuts down a portion of said delay chain circuit to conserve power in said power-down mode.

* * * * *